(12) United States Patent
Ogura (10) Patent No.: US 9,589,765 B2
(45) Date of Patent: Mar. 7, 2017

(54) SAMPLE SUPPORTING MEMBER FOR OBSERVING SCANNING ELECTRON MICROSCOPIC IMAGE AND METHOD FOR OBSERVING SCANNING ELECTRON MICROSCOPIC IMAGE

(71) Applicant: NATIONAL INSTITUTE OF ADVANCED INDUSTRIAL SCIENCE AND TECHNOLOGY, Chiyoda-ku (JP)

(72) Inventor: Toshihiko Ogura, Ibaraki (JP)

(73) Assignee: NATIONAL INSTITUTE OF ADVANCED INDUSTRIAL SCIENCE AND TECHNOLOGY, Chiyoda-ku (JP)

( * ) Notice: Subject to any disclaimer, the term of this patent is extended or adjusted under 35 U.S.C. 154(b) by 80 days.

(21) Appl. No.: 14/364,530

(22) PCT Filed: Dec. 26, 2012

(86) PCT No.: PCT/JP2012/008321
§ 371 (c)(1),
(2) Date: Jun. 11, 2014

(87) PCT Pub. No.: WO2013/099241
PCT Pub. Date: Jul. 4, 2013

(65) Prior Publication Data
US 2014/0346352 A1    Nov. 27, 2014

(30) Foreign Application Priority Data
Dec. 27, 2011 (JP) ................. 2011-286018

(51) Int. Cl.
*G21K 5/08* (2006.01)
*H01J 37/20* (2006.01)
*H01J 37/28* (2006.01)

(52) U.S. Cl.
CPC ............. *H01J 37/20* (2013.01); *G21K 5/08* (2013.01); *H01J 37/28* (2013.01);
(Continued)

(58) Field of Classification Search
CPC ..... G21K 5/08; H01J 37/20; H01J 2237/2007
See application file for complete search history.

(56) References Cited

U.S. PATENT DOCUMENTS 5,061,509 A * 10/1991 Naito ............... C08G 73/10
427/497
5,767,516 A     6/1998 Kawanami et al.
(Continued)

FOREIGN PATENT DOCUMENTS

EP     1 796 131 A2     6/2007
EP     1 998 206 A2    12/2008
(Continued)

OTHER PUBLICATIONS

Ogura, "Measurement of the unstained biological sample by a novel scanning electron generation X-ray microscope based on SEM", Biochemical and Biophysical Research Communications, vol. 385, Issue 4, Aug. 7, 2009, pp. 624-629.*
(Continued)

*Primary Examiner* — Jack Berman
*Assistant Examiner* — James Choi
(74) *Attorney, Agent, or Firm* — Oblon, McClelland, Maier & Neustadt, L.L.P.

(57) ABSTRACT

When injection of electrons into a sample supporting member causes a potential gradient between an insulative thin film and a conductive thin film at a site of electron beam injection, the potential barrier of the surface of the insulative thin film becomes thin, and an electron emission phenomenon is caused by tunnel effects. Secondary electrons caused in the insulative thin film tunnel to the conductive thin film
(Continued)

along the potential gradient. The secondary electrons, having tunneled, reach a sample while diffusing in the conductive thin film. In the case where the sample is a sample with a high electron transmittance, such as a biological sample, the secondary electrons also tunnel through the interior of the sample. The secondary electrons are detected to acquire an SEM image in which the inner structure of the sample is reflected.

14 Claims, 8 Drawing Sheets

(52) U.S. Cl.
CPC .................. *H01J 2237/2003* (2013.01); *H01J 2237/2004* (2013.01); *H01J 2237/2813* (2013.01)

(56) References Cited

U.S. PATENT DOCUMENTS

| | | | | |
|---|---|---|---|---|
| 2002/0088940 A1* | 7/2002 | Watanabe | ............ | H01J 37/224 250/310 |
| 2004/0046120 A1 | 3/2004 | Moses et al. | | |
| 2009/0095917 A1* | 4/2009 | Doring | .................. | H01J 49/145 250/424 |
| 2010/0140497 A1* | 6/2010 | Damiano, Jr. | .......... | B01L 3/508 250/440.11 |
| 2012/0182548 A1* | 7/2012 | Harb | ...................... | G01N 21/05 356/246 |
| 2012/0321037 A1* | 12/2012 | Ogura | ................ | G01N 23/2251 378/43 |

FOREIGN PATENT DOCUMENTS

| | | | | |
|---|---|---|---|---|
| EP | 2 108 947 A2 | 10/2009 | | |
| JP | 8 43600 | 2/1996 | | |
| JP | 2004 515049 | 5/2004 | | |
| JP | 2007 294365 | 11/2007 | | |
| JP | 2007294365 A | * 11/2007 | | |
| JP | 2008-47411 A | 2/2008 | | |
| JP | 2010 97844 | 4/2010 | | |
| JP | 2010 175389 | 8/2010 | | |
| JP | WO 2010134282 A1 | * 11/2010 | ............... | G21K 5/08 |
| WO | 2010 134282 | 11/2010 | | |
| WO | 2011 105421 | 9/2011 | | |

OTHER PUBLICATIONS

Ogura, "High-resolution x-ray observation of unstained samples by a newly developed SGXM", Nanotechnology 21 (2010) 295501.*
Extended European Search Report issued Jul. 22, 2015 in Patent Application No. 12863530.7.
Ogura, T. "A high contrast method of unstained biological samples under a thin carbon film by scanning electron microscopy" Biochemical and Biophysical Research Communications, vol. 377, pp. 79-84, 2008.
International Search Report Issued Jan. 29, 2013 in PCT/JP12/008321 Filed Dec. 26, 2012.

* cited by examiner

SAMPLE SUPPORTING MEMBER FOR OBSERVING SCANNING ELECTRON MICROSCOPIC IMAGE AND METHOD FOR OBSERVING SCANNING ELECTRON MICROSCOPIC IMAGE

TECHNICAL FIELD

The present invention relates to a technique for observing a scanning electron microscopic image and, in particular, to a technique suitable for observing, at high resolution, an electron microscopic image of an organic material sample and a biological sample that are susceptible to damage due to electron beam irradiation.

BACKGROUND ART

A scanning electron microscope (SEM) is an apparatus that has been widely used not only for morphological observation on an inorganic material sample or an organic material sample but also for observation on a biological sample, and is suitable for observing microorganisms, such as bacteria and viruses, which cannot be observed by the unaided eye.

Unfortunately, there are problems in that such a biological sample is susceptible to damage due to electron beam irradiation and it is difficult to acquire a high contrast image. For SEM observation on a biological sample, typically, a sample as an observation target is pretreated; in the pretreatment, the sample is fixed with formaldehyde or the like, and coated on the surface with gold, platinum, carbon or the like or stained with heavy metal or the like. Measures are taken where the treatment reduces damage to the sample due to an electron beam and increases the contrast.

Recently, a method has been developed that acquires a high contrast image without the aforementioned coating or staining on a biological sample (see Patent Literature 1 and Non Patent Literature 1). In this method, an observation target sample is caused to adhere to the undersurface (rear surface) of a thin sample supporting film (carbon film), and irradiated with an electron beam accelerated at a relatively low voltage from the top surface (front surface) of the sample supporting film. The electron beam incident on the sample supporting film spreads in the supporting film while diffusing. Electrons, reaching the undersurface of the supporting film and therearound, cause secondary electrons to be emitted. The secondary electrons are absorbed by the observation target sample adhering to the undersurface of the supporting film, thereby forming contrast.

The energy of such secondary electrons is significantly low, which is about 10 eV. The electrons cause almost no damage even if being absorbed by a biological sample. Furthermore, the degree of absorption of the electron beam is represented as-is as contrast. Accordingly, a significantly clear and high contrast SEM image can be acquired. Such an observation condition is referred to as an "indirect secondary electron contrast condition".

An X-ray microscope has also been proposed having a configuration that causes an electron beam to enter a metal thin film, irradiates an observation target sample with X-rays emitted from the metal thin film, and acquires an X-ray image (Patent Literatures 2 and 3). Such an X-ray microscope emits X-rays which has a high penetrating power of radiation and with which an observation target sample is to be irradiated. Accordingly, there is an advantageous effect of allowing the inner structure of a sample to be observed.

CITATION LIST

Patent Literature

Patent Literature 1: Japanese Patent Laid-Open No. 2010-097844
Patent Literature 2: Japanese Patent Laid-Open No. H8-43600
Patent Literature 3: Japanese Patent Laid-Open No. 2010-175389

Non Patent Literature

Non Patent Literature 1: T. Ogura, "A high contrast method of unstained biological samples under a thin carbon film by scanning electron microscopy", Biochem. Biophys. Res. Commun. Vol. 377, pp. 79-84 (2008)

SUMMARY OF INVENTION

Technical Problem

As described above, conventionally, for SEM observation on a biological sample which is susceptible to damage due to irradiation with an electron beam and of which a high contrast image is difficult to be acquired, treatment, such as surface coating or staining, is performed. However, such treatment requires experience and skill. Furthermore, chemical agents used for staining are often hazardous substances, such as uranyl acetate, which is unfavorable in view of environment.

There is a problem in that an SEM image observed in the indirect secondary electron contrast condition has significantly high contrast but has relatively low resolution. Furthermore, secondary electrons with low energy accelerated in an ordinary condition cannot pass through the interior of an observation sample. Accordingly, such secondary electrons are unsuitable for observing an inner structure.

In order to acquire a high contrast image using an X-ray microscope having a configuration that causes an electron beam to enter a metal thin film and generate X-rays, with which an observation target sample is irradiated, the amount of incident electron beam is required to be large, because the conversion efficiency from an electron beam into X-rays is low. Such a large current condition causes problems in that the resolution is reduced, the metal thin film generates heat, and the sample is damaged.

The present invention is made in view of such problems. It is an object of the present invention to provide a technique allowing electron microscopic images of an organic material sample and a biological sample, which are susceptible to damage due to electron beam irradiation, to be observed at high resolution without treatment, such as surface coating or staining.

Solution to Problem

In order to solve the foregoing problems, a sample supporting member used for observing a scanning electron microscopic image according to the present invention, includes a laminate of an insulative thin film and a conductive thin film, wherein a surface on a side of the insulative thin film is an electron beam incident surface, and a surface on a side of the conductive thin film is a sample adhesion surface.

Preferably, the insulative thin film has a thickness of 10 to 200 nm.

Preferably, the insulative thin film has an electric resistivity of at least 1000 Ωm.

For instance, the insulative thin film is made of a material principally containing any of silicon nitride, silicon oxide, and polyimide.

Preferably, the conductive thin film has a thickness of 200 nm or less.

Preferably, the conductive thin film is made of a material principally containing any of nickel, titanium, aluminum, gold, silver, copper, cobalt, molybdenum, tantalum, tungsten, and osmium.

For instance, the sample adhesion surface of the conductive thin film is subjected to hydrophilization treatment.

For instance, a sample adsorption layer is provided on the sample adhesion surface of the conductive thin film.

As an embodiment, there is a configuration where a pressure-resistant thin film provided facing the sample adhesion surface of the laminate of the insulative thin film and the conductive thin film is arranged so as to secure an interval between the pressure-resistant thin film and the laminate, each of the laminate of the insulative thin film and the conductive thin film, and the pressure-resistant thin film has a pressure resistance of at least one atmosphere, and a space between the laminate and the pressure-resistant thin film can be enclosed at an atmospheric pressure.

As an embodiment, there is a configuration where the conductive thin film is provided with an electrode for potential control for the conductive thin film.

A sample holder for observing a scanning electron microscopic image according to the present invention includes the foregoing sample supporting member, and further includes a terminal for applying a voltage to the electrode in response to an external input.

A sample holder for observing a scanning electron microscopic image according to the present invention includes the foregoing sample supporting member, wherein a field stop is provided on at least one of the side of the electron beam incident surface and a side of an electron beam emission surface.

A method for observing a scanning electron microscopic image according to the present invention is a method for observing a scanning electron microscopic image using the foregoing sample supporting member, an acceleration voltage for an incident electron beam is set to a value allowing at least 60% of incident electrons to be scattered, absorbed or shielded by the laminate of the insulative thin film and the conductive thin film.

A method for observing a scanning electron microscopic image according to the present invention is a method for observing a scanning electron microscopic image using the foregoing sample holder wherein an image is observed with a potential of the terminal that is a ground potential of a scanning electron microscope or a potential higher than the ground potential.

Advantageous Effects of Invention

The sample supporting member used for observing a scanning electron microscopic image according to the present invention includes the laminate of the insulative thin film and the conductive thin film; the side of the insulative thin film is an electron beam incident surface, and the side of the conductive thin film is a sample adhesion surface.

Since there are almost no free electrons in the insulative thin film on which an electron beam is incident, a negative potential is caused according to the amount of injected electrons. Accordingly, a potential difference occurs against the sample adhering side of the conductive thin film. Each of the films is a thin film. Accordingly, the potential gradient formed therebetween is significantly large. Secondary electrons occurring in the insulative thin film are released to the conductive thin film owing to the tunnel effects due to the large potential gradient, and pass through the observation sample.

Accordingly, the spatial distribution of the transmission electrons (tunnel electrons) is recorded, which allows the inner structure of the observation sample to be observed, and enables a high contrast image to be acquired without treatment, such as staining.

The potential gradient occurring in the insulative thin film is substantially parallel to the incident direction of the electron beam (substantially perpendicular to the electron beam incident surface of the insulative thin film). The direction in which secondary electrons passing to the conductive thin film owing to tunnel effects are emitted is substantially perpendicular to the sample adhesion surface. Accordingly, the transmission secondary electrons enter the observation sample without being spatially spread, thereby allowing high resolution to be achieved.

Furthermore, the energies of electrons reaching the observation sample owing to the tunnel effects are significantly lower than the energy of the incident electron beam. Accordingly, damage to the sample can be significantly reduced in comparison with conventional observation.

As described above, the present invention allows the sample supporting member having a simple structure to achieve high contrast, high resolution, and reduction in damage to the observation sample.

DESCRIPTION OF EMBODIMENTS

Hereinafter, referring to the drawings, a sample supporting member and a sample holder and a method for observing a scanning electron microscopic image according to the present invention are described.

Figure 1:
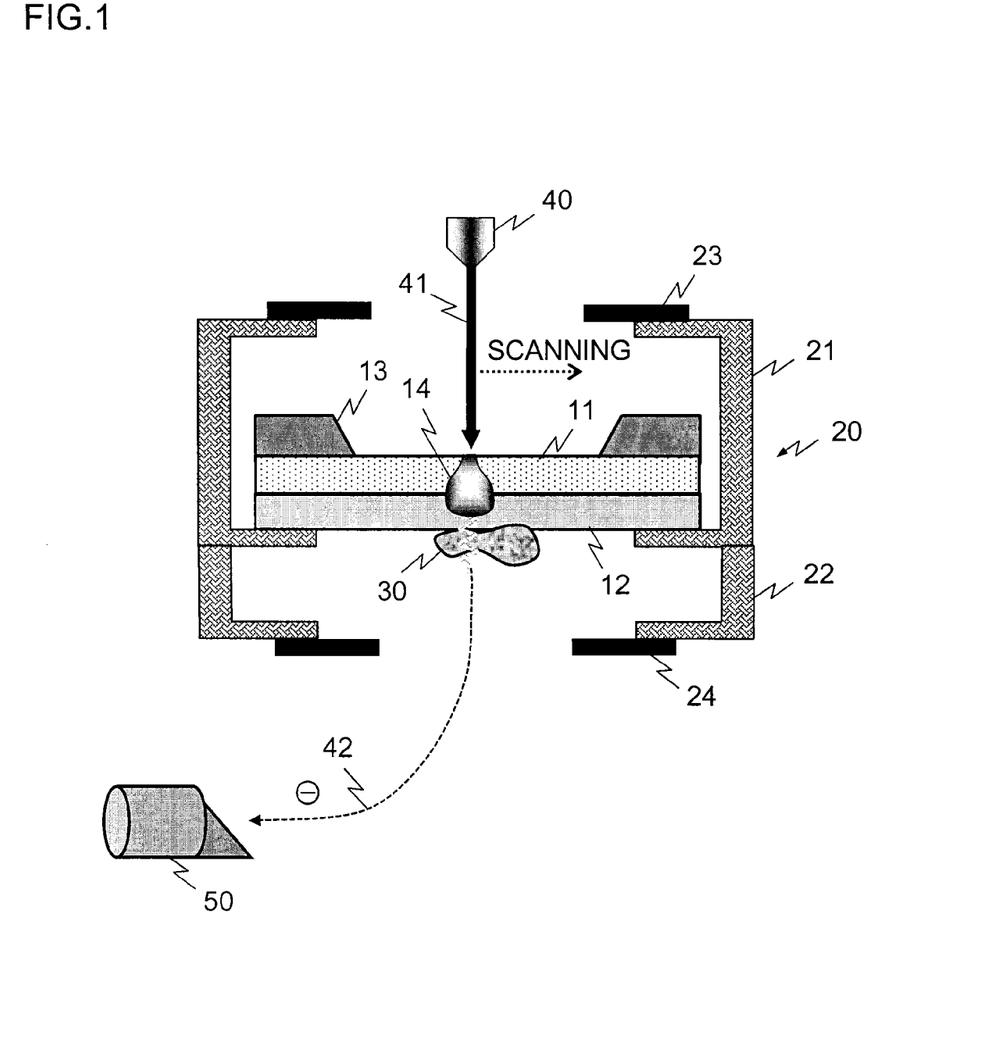
FIG. 1 is a block diagram for illustrating an overview of a configurational example of a sample supporting member and a sample holder according to the present invention.

FIG. 1 is a block diagram for illustrating an overview of configurational examples of a sample supporting member and a sample holder according to the present invention. The sample supporting member is a laminate of an insulative thin film 11 and a conductive thin film 12. An electron beam 41 emitted from an electron gun 40 is incident on the insulative thin film. The undersurface of the conductive thin film 12 is a sample adhesion surface, where a sample 30 to be an observation target is held by adsorption or the like. What is indicated by sign 13 is a frame for securing a mechanical strength of the sample supporting member. The electron beam 41 scans the electron beam incident surface of the insulative thin film 11, and acquires a two-dimensional SEM image through an intensity profile acquired by a secondary electron detector 50 detecting secondary electrons 42 having passed through the sample 30.

For the sake of reducing damage to the sample 30 by the electron beam 41, the acceleration voltage for the incident electron beam 41 is set to a value such that an appropriate amount of incident electrons are scattered, absorbed or shielded by the laminate of the insulative thin film 11 and the conductive thin film 12. For instance, the acceleration voltage for the incident electron beam 41 is set to a value such that at least 60% of incident electrons are scattered, absorbed or shielded by the laminate of the insulative thin film and the conductive thin film.

The incident electron beam 41 spreads in the insulative thin film 11 while diffusing (diffusion region 14), and reaches the undersurface (sample adhesion surface) of the conductive thin film 12 while generating secondary electrons. When the electron beam 41 is incident, the potential of the insulative thin film 11 becomes a negative potential according to the amount of electron injection owing to the insulation of the insulative thin film 11. Meanwhile, electrons injected into the conductive thin film 12 that has conductivity are ejected out of the film through an upper main body 21 and a lower main body 22 of a sample holder 20 accommodating the sample supporting member. Accordingly, the electrons are not accumulated in the conductive thin film, and the potential of the conductive thin film 12 is not changed. Thus, injection of electrons into the sample supporting member causes a potential difference between the insulative thin film 11 and the conductive thin film 12 at a site on which the electron beam is incident. The potential difference has a value exceeding several hundred voltages in a typical observation condition according to the present invention.

It is preferred that the potential of the conductive thin film 12 be set to the ground potential (0 V potential) in an SEM apparatus or a potential higher than the ground potential. Accordingly, the conductive thin film 12 may be provided with an electrode or the like for controlling the potential, and voltage application from the outside through a terminal or the like provided at the sample holder 20 may control the potential of the conductive thin film 12.

The thickness of the insulative thin film 11 is configured to, for instance, 10 to 200 nm. The electric resistivity is configured to, for instance, 1000 Ωm or higher. The material of such an insulative thin film 11 may be exemplified as a material principally containing any of polyimides, such as silicon nitride, silicon oxide, and Kapton (registered trademark).

The conductive thin film 12 has a thickness, for instance, 200 nm or less. The material of the conductive thin film 12 may be exemplified as a material principally containing any of nickel, titanium, aluminum, gold, silver, copper, cobalt, molybdenum, tantalum, tungsten, and osmium.

For instance, provided that the thickness of the insulative thin film 11 is about 50 nm and the potential difference is about 500 eV, the potential gradient becomes a large value as much as 100 Mev/cm. Typically, under a potential gradient of 100 Mev/cm, the potential barrier of the front surface of the insulative thin film 11 becomes thin, and an electron emission phenomenon (electric field emission phenomenon) is caused by a tunnel effect. Accordingly, secondary electrons caused in the insulative thin film 11 tunnel to the conductive thin film 12 along the potential gradient. Since the energy of the secondary electrons is about 10 eV or less, it can be considered that the de Broglie wavelength is long and the tunnel transmittance is high. Thus tunneling secondary electrons diffuse in the conductive thin film 12 and reach the sample 30. However, in the case where the sample 30 has a high electron transmittance, such as a biological sample, the secondary electrons also tunnel through the inside of the sample 30. The secondary electrons 42 are detected by the secondary electron detector 50, and an SEM image in which the inner structure of the sample 30 is reflected is acquired.

The potential barrier in the sample 30 is reflected in such an SEM image. Accordingly, a high contrast image can be acquired without special treatment, such as staining. Electrons entering and passing through the sample 30 are mainly tunnel electrons with a low energy. Accordingly, the damage to the sample 30 is significantly reduced.

Thus, the sample supporting member according to the present invention that includes the laminate of the insulative thin film and the conductive thin film allows the electron beam entering the inside of the insulative thin film almost without free electrons to cause a negative potential, and forms a large potential gradient against the conductive thin film. Use of the potential gradient allows secondary electrons occurring in the insulative thin film to tunnel to the conductive thin film. Furthermore, the electrons are caused to tunnel through the sample 30. Accordingly, a high contrast image in which the sample inner structure is reflected can be acquired without treatment, such as staining.

The potential gradient occurring in the insulative thin film 11 is substantially parallel to the incident direction of the electron beam 41 (substantially perpendicular to the electron beam incident surface of the insulative thin film 12). Accordingly, the emission direction of secondary electrons passing to the conductive thin film 12 owing to the tunnel effect is substantially perpendicular to the sample adhesion surface. The secondary electrons passing from the insulative thin film 11 thus enter the observation sample 30 without spatially spreading, thereby allowing high resolution to be achieved. Furthermore, the energies of electrons reaching the observation sample 30 owing to the tunnel effect are much lower than the energy of the incident electron beam. Accordingly, the damage to the sample 30 can be significantly reduced in comparison with that in a conventional observation.

The present invention can thus achieve high contrast, high resolution, and low damage to an observation sample through use of the sample supporting member having a simple structure.

The sample adhesion surface of the conductive thin film 12 may be subjected to hydrophilization treatment for allowing a water-soluble sample or the like to be adsorbed. Alternatively, a sample adsorption layer for allowing a biological sample or the like to be adsorbed may be provided on the sample adhesion surface of the conductive thin film 12.

As shown in FIG. 1, a field stop 23 may be provided above the sample supporting member (on the side of the electron beam incident surface), and a field stop 24 may be provided below the sample supporting member (on the side of the electron beam emission surface). The field stop 23 contributes to preventing secondary electrons released upward from the electron beam incident site from leaking outside of the sample holder 20. Such secondary electrons do not include information on the sample 30. Accordingly, detection of these electrons reduces image quality. The field stop 24 is for limiting the viewing angle of secondary electrons emitted from the lower portion of the sample holder 20 and detected by the secondary electron detector 50, and contributes to improvement in the resolution of an observed image.

Figure 2A:
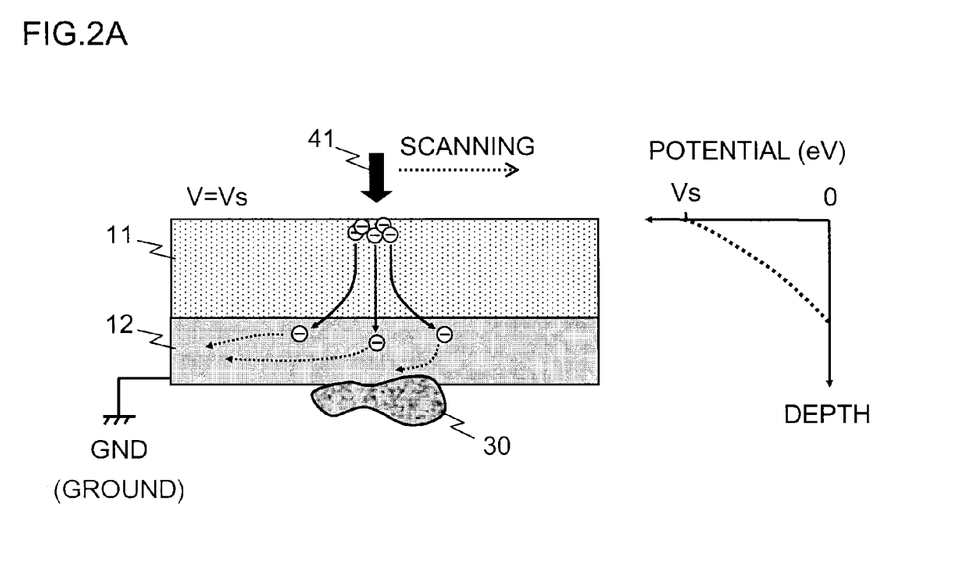
FIG. 2A is a schematic diagram for illustrating a potential distribution caused in an insulative thin film when being irradiated with an electron beam during SEM observation on a biological sample adhering to the sample supporting member of the present invention.
Figure 2B:
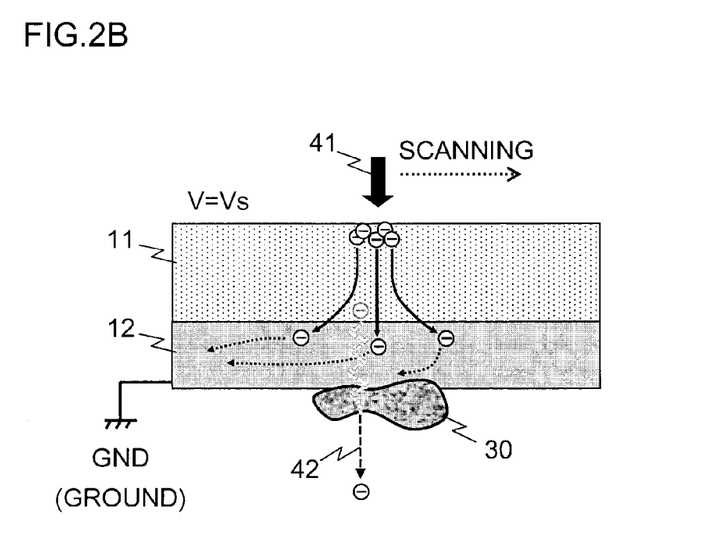
FIG. 2B is a schematic diagram showing situations where secondary electrons caused around the boundary between an insulative thin film and a conductive thin film pass through the interior of the conductive thin film owing to a tunnel effect under the potential distribution shown in FIG. 2A.

FIGS. 2A and 2B are a schematic diagram for illustrating the potential distribution caused in the insulative thin film when being irradiated with an electron beam during SEM observation on a biological sample adhering to the sample supporting member of the present invention, and a schematic diagram showing situations where secondary electrons caused around the boundary between the insulative thin film and the conductive thin film pass through the interior of the conductive thin film owing to a tunnel effect under the potential distribution shown in FIG. 2A, respectively.

The front surface of the insulative thin film 11 is irradiated with the incident electron beam 41 in a state of being narrowed to a diameter of several nanometers. A large amount of incident electrons are injected into an incident region of the electron beam, which is a significantly narrow region. As a result, the potential of the incident electron beam 41 on the side of the electron beam incident surface becomes a negative potential (V=$V_s$). In the case where the conductive thin film 12 is set to the ground potential ($V_G$=0), electrons passing through the insulative thin film 11 and entering the conductive thin film 12 are quickly excluded from the conductive thin film 12, the conductive thin film 12 is maintained to be at the ground potential ($V_G$=0), and a potential gradient is formed between the ground potential and the potential (V=0) of the incident electron beam 41 on the surface on the side of the conductive thin film 12.

As described above, provided that the thickness of the insulative thin film 11 is 50 nm and the potential of the electron beam irradiation region on the side of the electron beam incident surface is −500 V, the potential gradient formed in the insulative thin film 11 is 100 MeV/cm, which is a significantly large value sufficient for emitting electrons in the insulative thin film 11 toward the conductive thin film 12 owing to an electric field emission phenomenon. Vertically below the electron beam irradiation region, the large potential gradient causes secondary electrons caused in the insulative thin film 11 and around the boundary between the insulative thin film 11 and the conductive thin film 12 to tunnel into the conductive thin film 12 and further pass through the conductive thin film 12 and the sample 30, and be emitted as secondary electrons 42 out of the sample supporting member. As described above, the energy of the secondary electrons is approximately 10 eV or less. Accordingly, the de Broglie wavelength is large in comparison with the diameter of an atom. Thus, quantum effects tend to be exerted, and the tunnel transmittance is high.

As described above, according to the present invention, the electron beam entering the inside of the insulative thin film 11 causes a negative potential to form a large potential gradient against the conductive thin film 12, and use of the potential gradient allows secondary electrons occurring in the insulative thin film 11 to tunnel to the conductive thin film 12.

The higher the potential gradient is, the higher the tunneling efficiency of such secondary electrons is. Accordingly, setting the side of the conductive thin film 12 to a positive potential can increase the tunneling efficiency of the secondary electrons.

Figure 3:
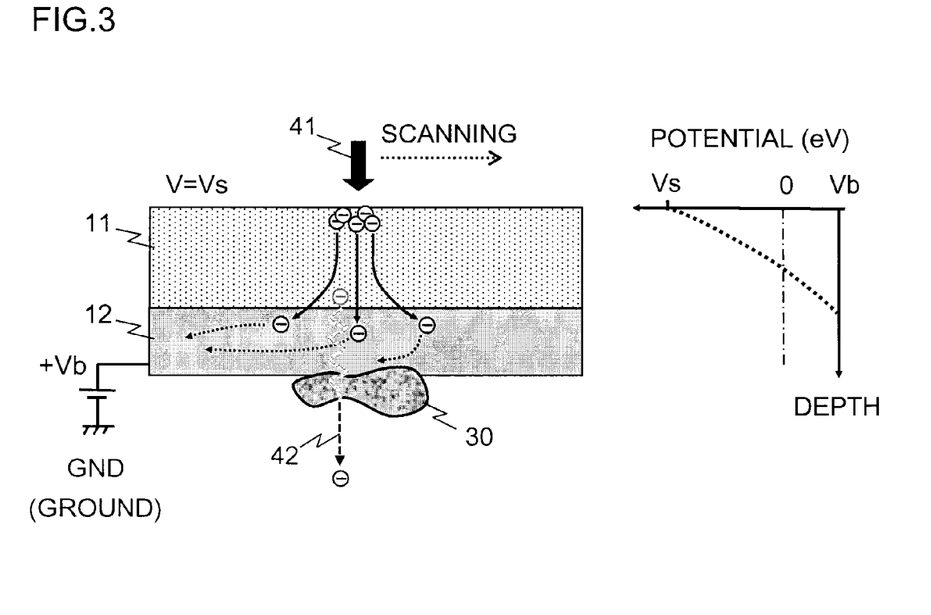
FIG. 3 is a schematic diagram for illustrating situations where a voltage is applied to the conductive thin film to a positive potential to increase the potential gradient in the insulative thin film.

FIG. 3 is a schematic diagram for illustrating situations where a voltage (+$V_b$) is applied to the conductive thin film 12 to a positive potential to increase the potential gradient in the insulative thin film 11. As shown in this diagram, the potential gradient caused in the insulative thin film 11 is increased as much as setting of the conductive thin film 12 to the positive potential (+$V_b$). The tunneling efficiency of the secondary electrons increases accordingly, which contributes to improvement in the resolution and contrast of the acquired SEM image.

Figure 4A:
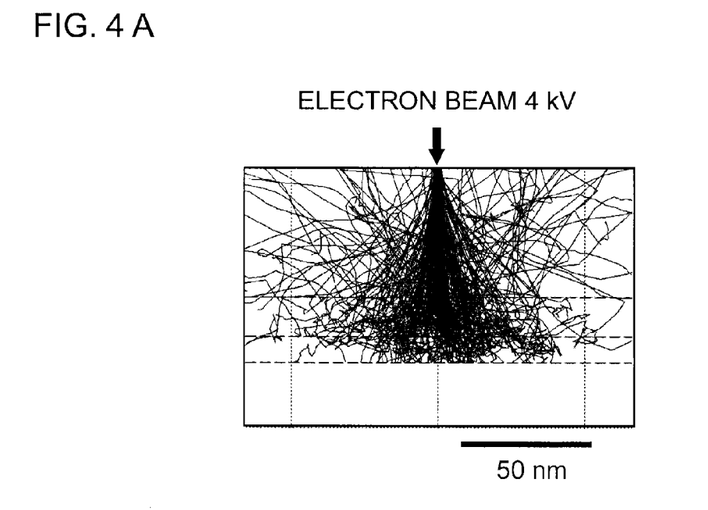
FIG. 4A is a diagram of a result of a Monte Carlo simulation of scattering situations of an electron beam in the case where the electron beam accelerated by an application voltage of 4 kV enters a sample supporting member that is laminated films including an insulative thin film made of a silicon nitride film (50 nm) and a conductive thin film made of an Ni film (15 nm) and an Au film (10 nm).
Figure 4B:
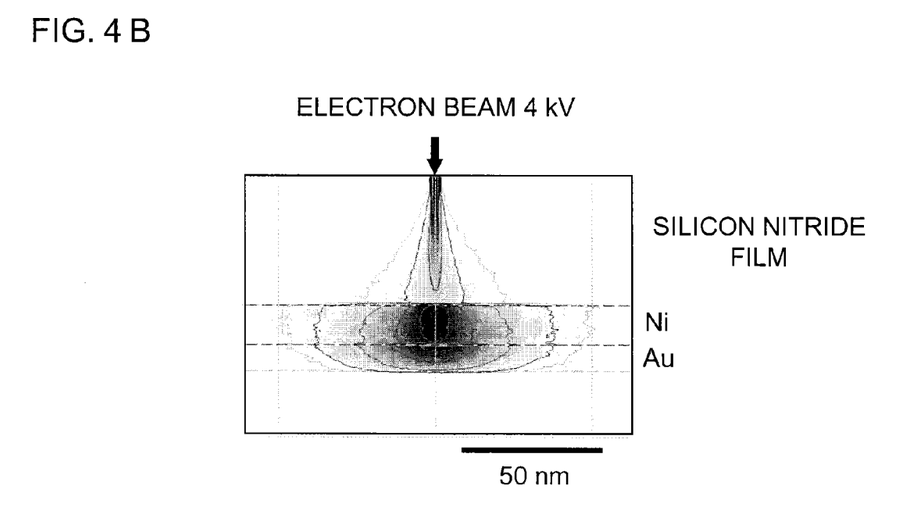
FIG. 4B is a diagram of a result of a Monte Carlo simulation of an energy density distribution in a film in scattering situations of the electron beam shown in FIG. 4A.

FIG. 4A is a diagram of a result of a Monte Carlo simulation of scattering situations of an electron beam in the case where the electron beam accelerated by an application voltage of 4 kV enters a sample supporting member that is laminated films including the insulative thin film made of a silicon nitride film (50 nm) and the conductive thin film made of an Ni film (15 nm) and an Au film (10 nm). FIG. 4B is a diagram of a result of a Monte Carlo simulation of an energy density distribution in a film in scattering situations of the electron beam shown in FIG. 4A.

As shown in FIG. 4B, electrons are scattered in a relatively weak manner in the silicon nitride thin film, while the electrons are strongly scattered and absorbed in the metal films of Ni and Au. At an acceleration voltage of 4 kV, at least 90% of electrons entering the silicon nitride thin film are scattered, absorbed or shielded in the laminate of the insulative thin film and the conductive thin film. Only a small number of incident electrons (primary electrons) pass to the sample. Accordingly, damage to the sample is significantly reduced.

Figure 5:
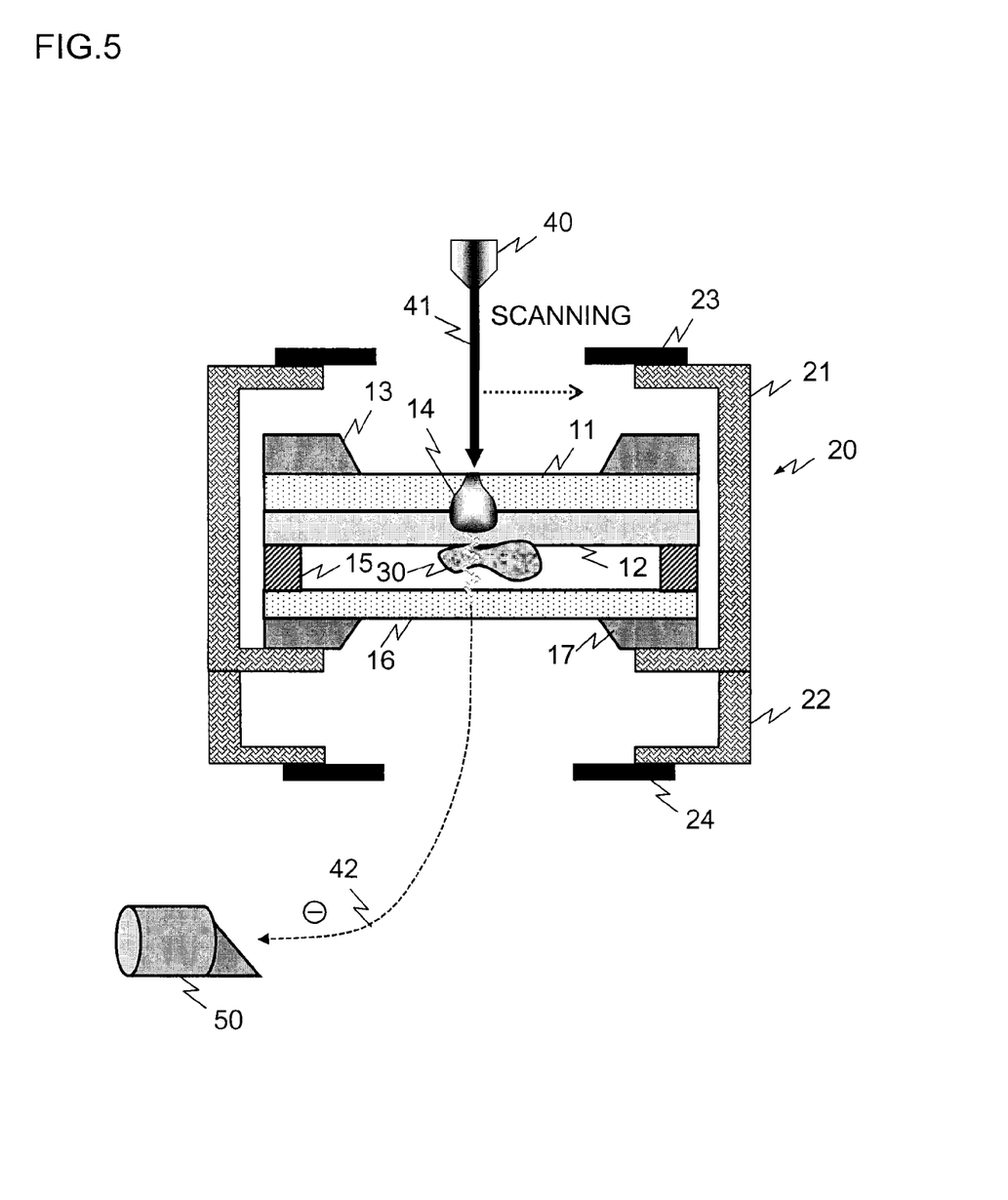
FIG. 5 is a schematic diagram for illustrating situations where a biological sample is sealed in the sample supporting member provided with a pressure-resistant thin film facing the insulative thin film and a sample adhesion surface of the laminate of the conductive thin film.

FIG. 5 is a diagram for illustrating the configuration of the sample supporting member according to an embodiment where a pressure-resistant thin film 16 is provided facing the sample adhesion surface of the laminate of the insulative thin film 11 and the conductive thin film 12, with a spacer 15 intervening therebetween, and a frame 17 is also formed on the pressure-resistant thin film 16. The sample 30 is stored in a space between the pressure-resistant thin film 16 and the sample adhesion surface of the conductive thin film 12 of the sample supporting member; the space has an interval defined by the spacer 15. For instance, each of the insulative thin film 11 and the conductive thin film 12 has a pressure resistance of at least 0.5 atmospheres. The laminate has a pressure resistance of at least one atmosphere. The pressure-resistant thin film 16 has a pressure resistance of at least one atmosphere. The space between the laminate and the pressure-resistant thin film 16 is sealed (hermetically enclosed) at the atmospheric pressure, which can prevent damage due to a vacuum and allow an original form to be observed.

Figure 6A:
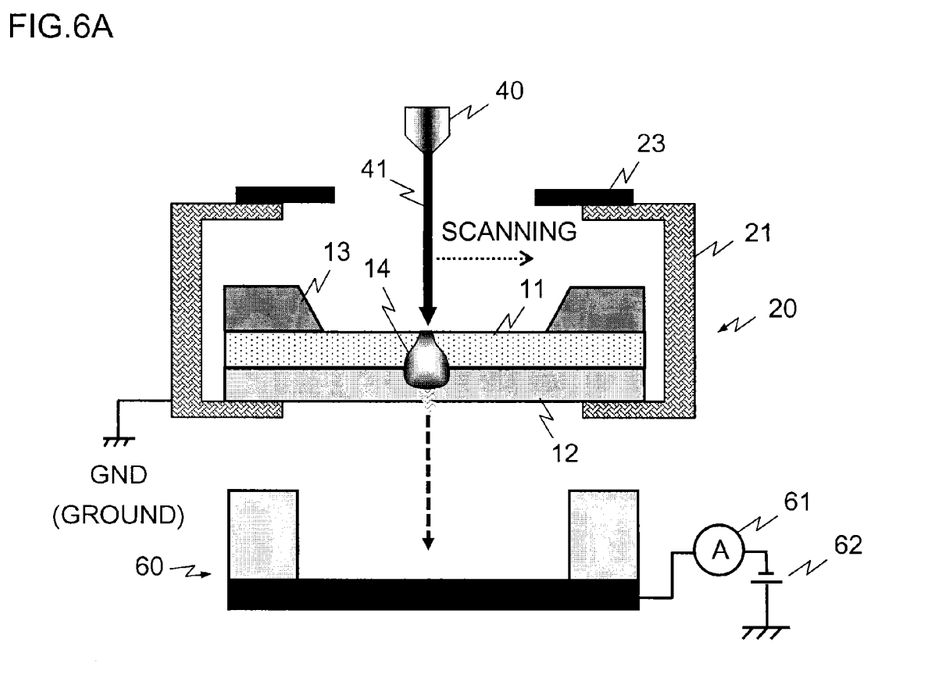
FIG. 6A is a block diagram in the case where an electron beam accelerated by an application voltage of 4 kV enters the sample supporting member that is laminated films including an insulative thin film made of a silicon nitride film (50 nm) and an conductive thin film made of an Ni film (15 nm) and an Au film (10 nm), and the value of current of electrons passing through the metal laminated films is measured.
Figure 6B:
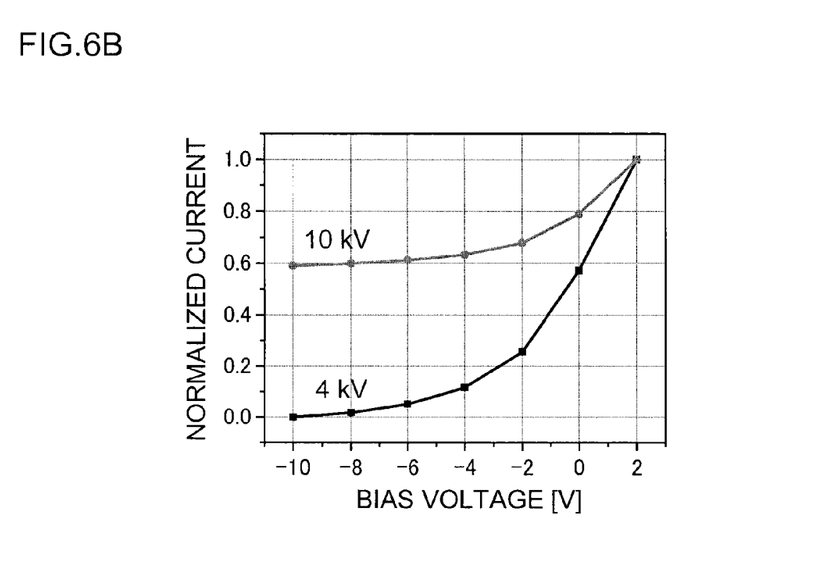
FIG. 6B shows a result of an experiment identifying bias voltage dependency of the value of current due to transmission electrons using a measurement system shown in FIG. 6A.

FIGS. 6A and 6B are a block diagram in the case where an electron beam accelerated by an application voltage of 4 kV enters the sample supporting member that is laminated films of an insulative thin film made of a silicon nitride film (50 nm) and a conductive thin film made of an Ni film (15 nm) and an Au film (10 nm), and a result of an experiment identifying bias voltage dependency of the value of current due to transmission electrons using a measurement system shown in FIG. 6A, respectively.

Secondary electrons passing through the laminate are detected as current by a measurement cup 60 provided below the sample supporting member. Here, for instance, application of a negative bias voltage from an external power source 62 via an ammeter 61 to the measurement cup 60 pushes electrons having a lower energy than the bias voltage among the transmission electrons back to the sample holder 20. Accordingly, the electrons pushed back thereto are not detected by the measurement cup 60. Only transmission electrons having an energy of at least the bias voltage are thus measured by the measurement cup 60. On the basis of this principle, gradual increase in the bias voltage can acquire the energy distribution of transmission electrons.

FIG. 6B shows current (normalized current) measured by the measurement cup 60 when the bias voltage is changed from +2 V to −10 V. In the case where the acceleration voltage of the incident electron beam is 4 kV, reduction of the bias potential from +2 V exponentially reduces the current value. The current value becomes substantially zero when the bias potential is −10 V. This means that substantially all the transmission electrons have a low energy of 10 V or less. This also means that substantially no incident electron (primary electron) has passed. Meanwhile, in the case where the acceleration voltage of the incident electron beam is 10 kV, 60% of current is measured even with the bias potential of −10 V. This means that most of detected electrons have an energy exceeding −10 V, and indicates that the incident electrons (primary electrons) pass at a non-negligible level.

Figure 7:
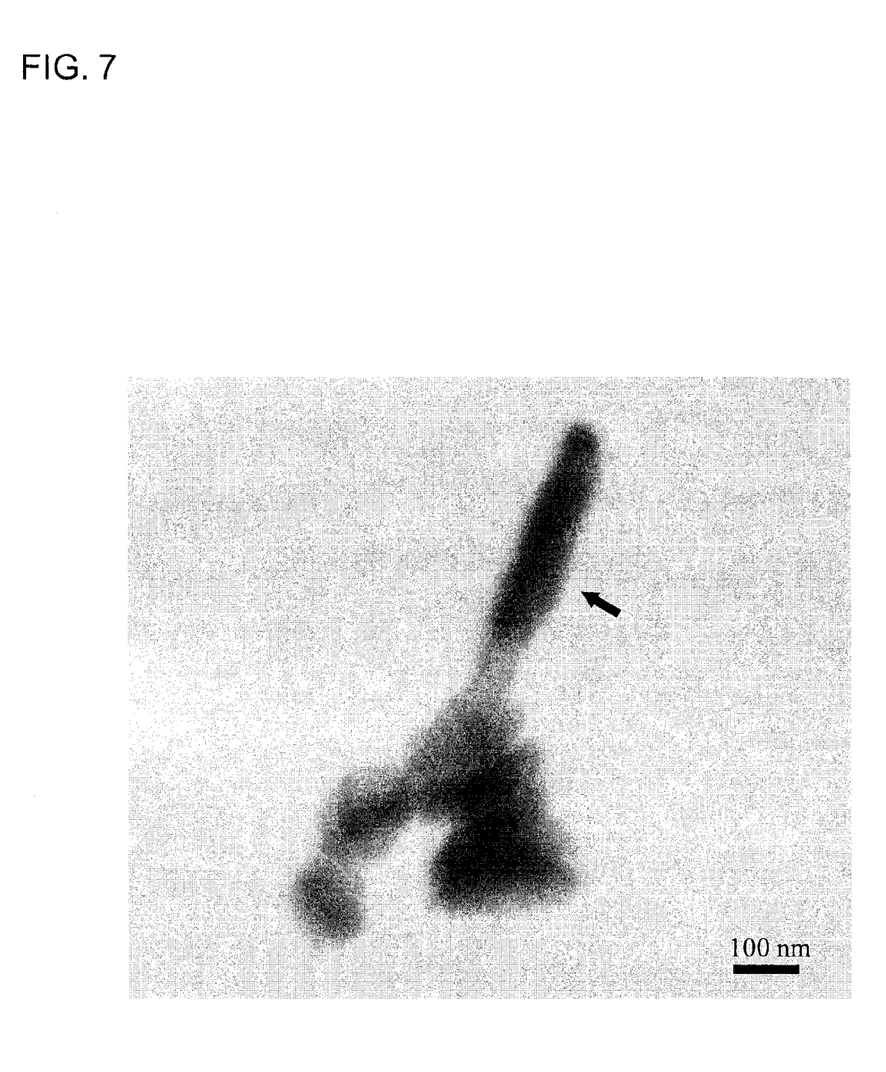
FIG. 7 shows an SEM image through observation at a magnification of 60000 on viruses adhering to the sample supporting member of the present invention.

FIG. 7 shows an SEM image through observation at a magnification of 60000 on viruses (baculoviruses) adhering to the sample supporting member of the present invention in an unstained state. The adopted sample supporting member is laminated films including an insulative thin film made of a silicon nitride film (50 nm) and a conductive thin film made of an Ni film (15 nm) and an Au film (10 nm). The acceleration voltage for an incident electron beam is 4 kV.

At a part indicated by the arrow shown in FIG. 7, a rod-shaped baculovirus having a length of about 300 nm is clearly observed. A sac-shaped form containing proteins and called an envelope is also observed therebelow. Furthermore, the interior of the virus and a light and shade structure in the envelop are observed, in which the inner structure is reflected.

As shown in FIG. 6B, in the case of an acceleration voltage of 4 kV, only electrons having an energy of 10 eV or less are detected. Accordingly, the SEM image of FIG. 7 is acquired on the basis of transmission electrons having an energy of 10 eV or less. In general, it is considered that electrons with a low energy of 10 eV or less have a penetrating power of about 10 nm. In SEM observation using the sample supporting member according to the present invention, even transmission electrons having an energy of 10 eV or less pass through the sample having a thickness of at least 50 nm, thereby allowing the inner structure to be observed. It is considered that this can be made as a result of quantum effects due to the configuration of the present invention.

Figure 8:
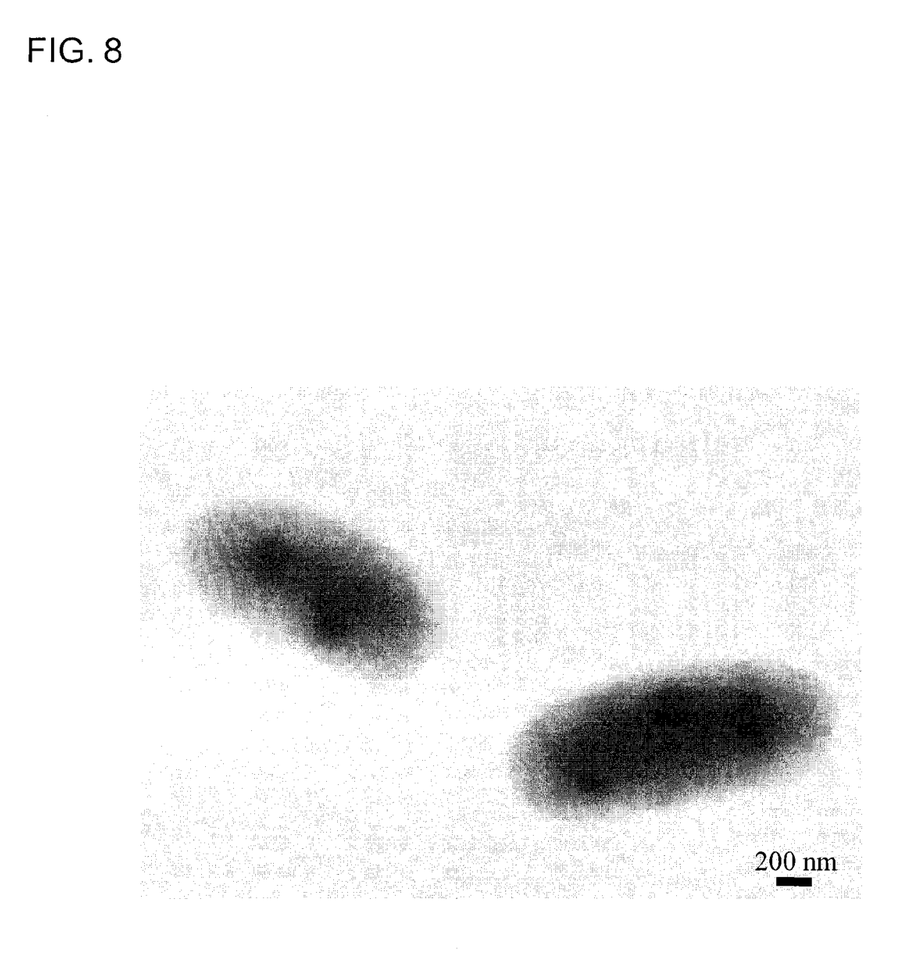
FIG. 8 shows an SEM image through observation at a magnification of 30000 on bacteria adhering to the sample supporting member of the present invention in a state of being sealed at the atmospheric pressure.

FIG. 8 shows an SEM image through observation at a magnification of 30000 on bacteria adhering to the sample supporting member of the present invention in a state of being sealed at the atmospheric pressure. This SEM image is acquired using the sample supporting member of the embodiment shown in FIG. 5 where the pressure-resistant thin film is made of a silicon nitride thin film through observation on bacteria as a sample under the atmospheric pressure. The acceleration voltage for the incident electron beam is 4 kV.

Also in the SEM image, the inner structures of the bacteria are identified at significantly high resolution.

As described above, the present invention can acquire a high contrast image from a sample, such as bacteria, viruses or protein complexes, without special staining or fixing operations. Transmission secondary electrons from the sample supporting member enter the observation sample without spatially spreading. Accordingly, high resolution can be achieved.

Furthermore, the energies of electrons reaching the observation sample are significantly lower than the energy of the incident electron beam owing to tunnel effects. Accordingly, damage to the sample is significantly reduced in comparison with conventional observation.

INDUSTRIAL APPLICABILITY

The present invention provides a technique allowing electron microscopic images of an organic material sample and a biological sample, which are susceptible to damage due to electron beam irradiation, to be observed at high resolution without treatment, such as surface coating or staining.

REFERENCE SIGNS LIST 11 insulative thin film
12 conductive thin film
13, 17 frame
14 diffusion region
15 spacer
16 pressure-resistant thin film
20 sample holder
21 upper main body
22 lower main body
23, 24 field stop 30 sample
40 electron gun
41 electron beam
42 secondary electrons
50 secondary electron detector
60 measurement cup
61 ammeter
62 external power source

The invention claimed is:

1. A sample supporting member for observing a scanning electron microscopic image arranged in an optical barrel under reduced-pressure ambient, comprising
a laminate comprising an insulative thin film and a conductive thin film, wherein a surface on a side of the insulative thin film is an electron beam incident surface, and a surface on a side of the conductive thin film is a sample adhesion surface exposed to the reduced-pressure ambient,
wherein
the sample adhesion surface includes an emission surface for electrons tunneling from the insulative thin film and through a sample on the sample adhesion surface and thereby contributing to forming the scanning electron microscopic image.

2. The sample supporting member according to claim 1, wherein the insulative thin film has a thickness of 10 to 200 nm.

3. The sample supporting member according to claim 1, wherein the insulative thin film has an electric resistivity of at least 1000 Ωm.

4. The sample supporting member according to claim 2, wherein the insulative thin film is made of a material principally containing any of silicon nitride, silicon oxide, and polyimide.

5. The sample supporting member according to claim 1, wherein the conductive thin film has a thickness of 200 nm or less.

6. The sample supporting member according to claim 5, wherein the conductive thin film is made of a material principally containing any of nickel, titanium, aluminum, gold, silver, copper, cobalt, molybdenum, tantalum, tungsten, and osmium.

7. The sample supporting member according to claim 1, wherein the sample adhesion surface of the conductive thin film is subjected to hydrophilization treatment.

8. The sample supporting member according to claim 1, wherein a sample adsorption layer is provided on the sample adhesion surface of the conductive thin film.

9. The sample supporting member according to claim 1, wherein a pressure-resistant thin film provided facing the sample adhesion surface of the laminate of the insulative thin film and the conductive thin film is arranged so as to secure an interval between the pressure-resistant thin film and the laminate, each of the laminate of the insulative thin film and the conductive thin film, and the pressure-resistant thin film has a pressure resistance of at least one atmosphere, and a space between the laminate and the pressure-resistant thin film can be enclosed at an atmospheric pressure.

10. The sample supporting member according to claim 1, wherein the conductive thin film is provided with an electrode for potential control for the conductive thin film.

11. A sample holder for observing a scanning electron microscopic image, comprising the sample supporting member according to claim 10, and further comprising a terminal for applying a voltage to the electrode in response to an external input.

12. A sample holder for observing a scanning electron microscopic image, comprising the sample supporting member according to claim 1, wherein a field stop is provided on at least one of the side of the electron beam incident surface and a side of an electron beam emission surface.

13. A method for observing a scanning electron microscopic image using the sample supporting member according to claim 1,
wherein an acceleration voltage for an incident electron beam is set to a value allowing at least 60% of incident electrons to be scattered, absorbed or shielded by the laminate of the insulative thin film and the conductive thin film.

14. A method for observing a scanning electron microscopic image using the sample holder according to claim 11,
wherein an image is observed while a potential of the terminal that is a ground potential of a scanning electron microscope or a potential higher than the ground potential.

* * * * *